US012745680B2

(12) United States Patent
Hong et al.

(10) Patent No.: US 12,745,680 B2
(45) Date of Patent: Sep. 22, 2026

(54) SEMICONDUCTOR PACKAGE WITH REDUCED ADHESIVE FILLETS

(71) Applicant: Samsung Electronics Co., Ltd., Suwon-si (KR)

(72) Inventors: Jongpa Hong, Suwon-si (KR); Yeongkwon Ko, Suwon-si (KR); Gunho Chang, Suwon-si (KR); Wonkeun Kim, Suwon-si (KR); Wonyoung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 407 days.

(21) Appl. No.: 18/500,311

(22) Filed: Nov. 2, 2023

(65) Prior Publication Data

US 2024/0297150 A1 Sep. 5, 2024

(30) Foreign Application Priority Data

Mar. 3, 2023 (KR) ........................ 10-2023-0028515

(51) Int. Cl.
*H10W 90/00* (2026.01)
*H10W 72/00* (2026.01)
(Continued)

(52) U.S. Cl.
CPC .......... *H10W 90/00* (2026.01); *H10W 74/111* (2026.01); *H10W 72/0198* (2026.01);
(Continued)

(58) Field of Classification Search
CPC ............... H10W 90/00; H10W 74/111; H10W 72/0198; H10W 72/07353; H10W 72/334;
(Continued)

(56) References Cited

U.S. PATENT DOCUMENTS 10,319,696 B1 6/2019 Nakano
10,354,985 B2 7/2019 Chang et al.
(Continued)

FOREIGN PATENT DOCUMENTS

KR 10-2011-0001155 A 1/2011

OTHER PUBLICATIONS

Suh, E., et al. "NEPP studies on The Reliability of Flip Chip Solder Joints and 2.5/3D Packaging", NASA Electronic Parts and Packaging Program (NEPP) Jun. 17, 2020. (Year: 2020).*

*Primary Examiner* — J. E. Schoenholtz
(74) *Attorney, Agent, or Firm* — HARNESS, DICKEY & PIERCE, P.L.C.

(57) ABSTRACT

A semiconductor package includes a base chip, a first semiconductor chip on the base chip, the first semiconductor chip including first through-vias, first bump structures on the first front surface of the first semiconductor chip, a plurality of second semiconductor chips sequentially stacked on the first semiconductor chip, the plurality of second semiconductor chips including second through-vias, adhesive layers respectively on the second front surfaces of the plurality of second semiconductor chips, and an encapsulant between the base chip and the first semiconductor chip, the encapsulant covering at least a portion of each of the first semiconductor chip and the plurality of second semiconductor chips. The adhesive layers respectively have a width equal to or less than a width of the first semiconductor chip and a width of each of the plurality of second semiconductor chips in a direction, parallel to the upper surface of the base chip.

20 Claims, 13 Drawing Sheets

(51) Int. Cl.

| | |
|---|---|
| ***H10W 72/30*** | (2026.01) |
| ***H10W 72/90*** | (2026.01) |
| ***H10W 74/10*** | (2026.01) |
| ***H10W 74/15*** | (2026.01) |
| ***H10W 80/00*** | (2026.01) |
| ***H10W 90/20*** | (2026.01) |

(52) U.S. Cl.

CPC .... *H10W 72/07353* (2026.01); *H10W 72/334* (2026.01); *H10W 72/926* (2026.01); *H10W 74/15* (2026.01); *H10W 80/721* (2026.01); *H10W 90/297* (2026.01); *H10W 90/722* (2026.01); *H10W 90/724* (2026.01); *H10W 90/732* (2026.01)

(58) Field of Classification Search

CPC . H10W 72/926; H10W 74/15; H10W 80/721; H10W 90/297; H10W 90/722; H10W 90/724; H10W 90/732; H10W 72/072; H10W 72/073; H10W 72/20; H10W 72/30; H10W 72/851; H10W 72/90; H10W 74/117; H10W 74/121; H10W 74/014; H10W 99/00; H10W 20/20; H10W 70/611; H10W 70/65; H10W 90/701; H10P 72/7416; H10P 72/74

See application file for complete search history.

(56) References Cited

U.S. PATENT DOCUMENTS

| | | | | |
|---|---|---|---|---|
| 10,446,525 | B2 | 10/2019 | Choi et al. | |
| 10,825,798 | B2 | 11/2020 | Lee et al. | |
| 11,362,068 | B2 | 6/2022 | Park et al. | |
| 11,948,909 | B2 * | 4/2024 | Sun | H10W 72/0198 |
| 12,015,005 | B2 * | 6/2024 | Ko | H10W 90/00 |
| 2003/0052419 | A1 | 3/2003 | Ujiie et al. | |
| 2008/0048343 | A1 | 2/2008 | Grigg et al. | |
| 2014/0295620 | A1 | 10/2014 | Ito et al. | |
| 2015/0130030 | A1 | 5/2015 | Ma et al. | |
| 2017/0207199 | A1 * | 7/2017 | Kira | H10W 90/00 |
| 2017/0365591 | A1 | 12/2017 | Chang et al. | |
| 2018/0166420 | A1 * | 6/2018 | Park | H10W 90/00 |
| 2018/0286835 | A1 | 10/2018 | Nah | |
| 2020/0098719 | A1 * | 3/2020 | Park | H10W 74/012 |
| 2021/0143116 | A1 * | 5/2021 | Hong | H10W 72/072 |
| 2021/0210397 | A1 | 7/2021 | Kang et al. | |
| 2023/0223375 | A1 * | 7/2023 | Sun | H10W 72/0198 257/737 |
| 2024/0105627 | A1 * | 3/2024 | Hou | H10W 70/65 |
| 2025/0357358 | A1 * | 11/2025 | Yew | H10W 70/614 |
| 2025/0357427 | A1 * | 11/2025 | Huang | H10W 90/00 |

* cited by examiner

FIG. 7F

SEMICONDUCTOR PACKAGE WITH REDUCED ADHESIVE FILLETS

CROSS-REFERENCE TO RELATED APPLICATION(S)

This U.S. non-provisional patent application claims benefit of priority under 35 U.S.C. § 119 to Korean Patent Application No. 10-2023-0028515 filed on Mar. 3, 2023 in the Korean Intellectual Property Office, the disclosure of which is incorporated herein by reference in its entirety.

BACKGROUND

The present inventive concepts relate to semiconductor packages.

With a reduction in weight and implementation of high performance in electronic devices, the development of semiconductor packages, having a reduced size and high performance, has been required in the field of semiconductor packages. In order to reduce a size and a weight of semiconductor packages and implement high performance and high reliability in semiconductor packages, semiconductor packages in which a plurality of semiconductor chips are vertically stacked have been continuously researched and developed.

SUMMARY

Aspects of the present inventive concepts provide semiconductor packages having improved reliability.

According to aspects of the present inventive concepts, there is provided a semiconductor package including a base chip including lower pads on a lower surface, upper pads on an upper surface, and through-electrodes electrically connecting the lower pads and the upper pads to each other, a first semiconductor chip on the base chip, the first semiconductor chip including first front pads on a first front surface, first back pads on a first back surface, and first through-vias electrically connecting the first front pads and the first back pads to each other, first bump structures on the first front surface of the first semiconductor chip, the first bump structures electrically connecting the first front pads and the upper pads to each other, a plurality of second semiconductor chips sequentially stacked on the first semiconductor chip, the plurality of second semiconductor chips including second front pads on a second front surface, second back pads on a second back surface, and second through-vias electrically connecting the second front pads and the second back pads to each other, second bump structures on the second front surface of each of the plurality of second semiconductor chips, the second bump structures electrically connecting, to each other, the first back pads, the second front pads, and the second back pads opposing each other, adhesive layers respectively on the second front surfaces of the plurality of second semiconductor chips, the adhesive layers surrounding the second bump structures, and an encapsulant surrounding the first bump structures between the base chip and the first semiconductor chip, the encapsulant covering at least a portion of each of the first semiconductor chip and the plurality of second semiconductor chips. The adhesive layers may respectively have a width equal to or less than a width of the first semiconductor chip and a width of each of the plurality of second semiconductor chips in a direction, parallel to the upper surface of the base chip.

According to aspects of the present inventive concepts, there is provided a semiconductor package including a base chip, a first semiconductor chip on the base chip, first bump structures electrically connecting the base chip and the first semiconductor chip to each other, a second semiconductor chip on the first semiconductor chip, second bump structures electrically connecting the first semiconductor chip and the second semiconductor chip to each other, a first adhesive layer surrounding the second bump structures below the second semiconductor chip, and an encapsulant surrounding the first bump structures below the first semiconductor chip, the encapsulant covering a first side surface of the first semiconductor chip, a second side surface of the second semiconductor chip, and a side surface of the first adhesive layer. The first side surface of the first semiconductor chip, the second side surface of the second semiconductor chip, and the side surface of the first adhesive layer may be coplanar with each other.

According to aspects of the present inventive concepts, there is provided a semiconductor package including a base chip, a plurality of semiconductor chips sequentially stacked on the base chip, bump structures between the base chip and a lowermost semiconductor chip, among the plurality of semiconductor chips, the bump structures between the plurality of semiconductor chips, at least one adhesive layer surrounding some bump structures, among the bump structures, between the plurality of semiconductor chips, and an encapsulant surrounding some bump structures, among the bump structures, between the base chip and the lowermost semiconductor chip, the encapsulant in direct contact with a side surface of each of the plurality of semiconductor chips and a side surface of the at least one adhesive layer.

BRIEF DESCRIPTION OF DRAWINGS

The above and other aspects, features, and advantages of the present inventive concepts will be more clearly understood from the following detailed description, taken in conjunction with the accompanying drawings, in which:

FIGS. 7A to 7F are schematic cross-sectional views of a process of manufacturing a semiconductor package according to some example embodiments of the present inventive concepts.

DETAILED DESCRIPTION

Hereinafter, example embodiments will be described in detail. Unless otherwise described, the terms such as "upper," "upper portion," "upper surface," "lower," "lower portion," "lower surface," and "side surface" are based on the drawings, and may vary depending on a direction in which an element or component is actually arranged.

Figure 1A:
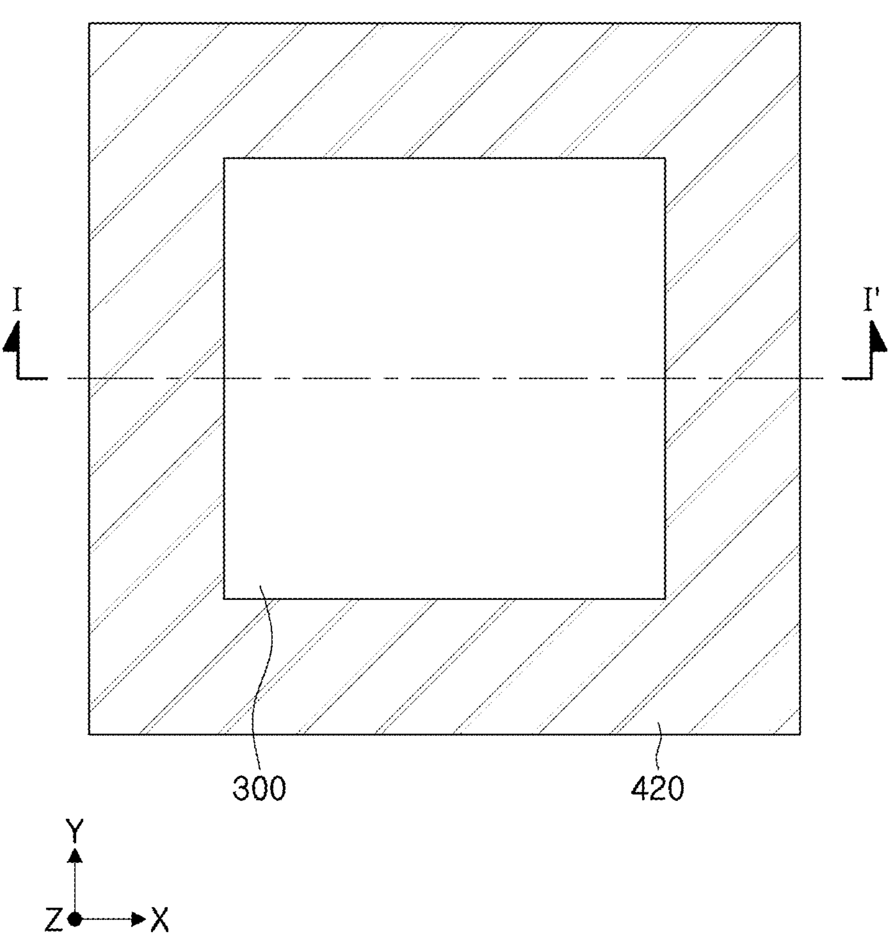
FIG. 1A is a plan view of a semiconductor package according to some example embodiments.
Figure 1B:
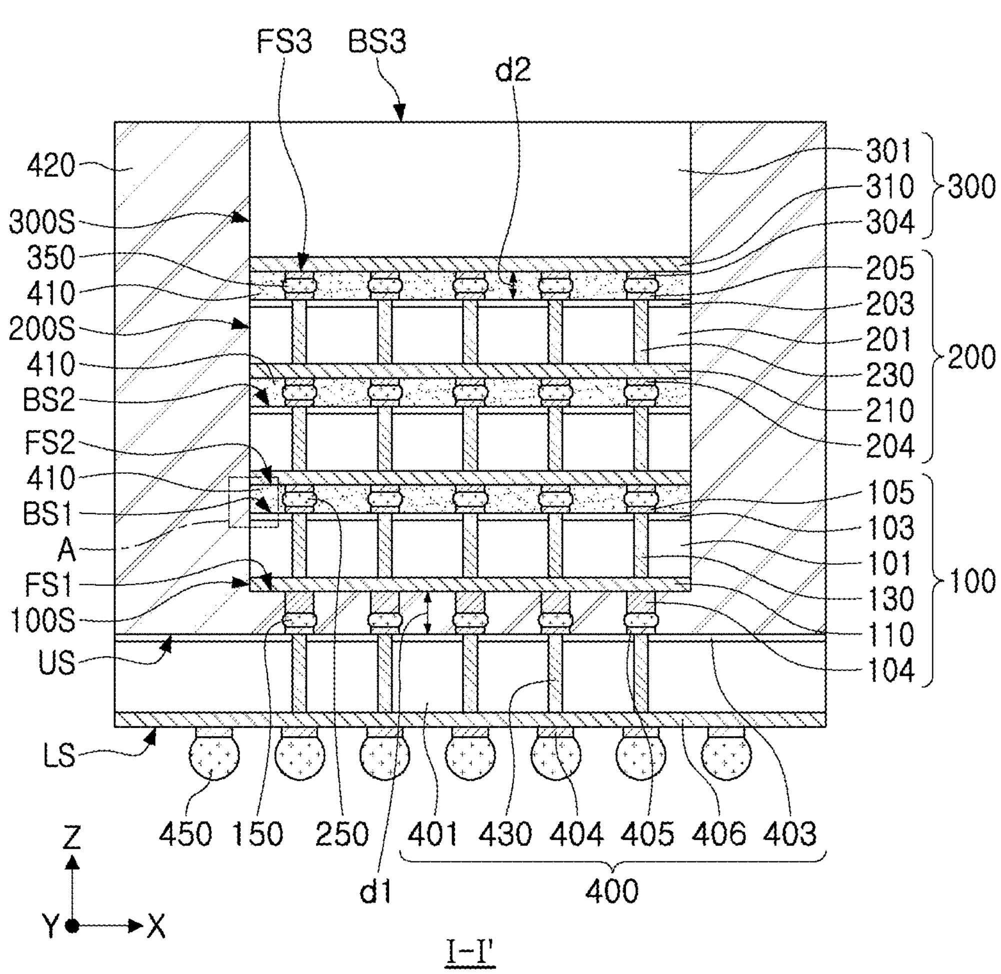
FIG. 1B is a cross-sectional view taken along line I-I' of FIG. 1A.

FIG. 1A is a plan view of a semiconductor package 1000 according to some example embodiments, and FIG. 1B is a cross-sectional view taken along line I-I' of FIG. 1A.

Figure 2A:
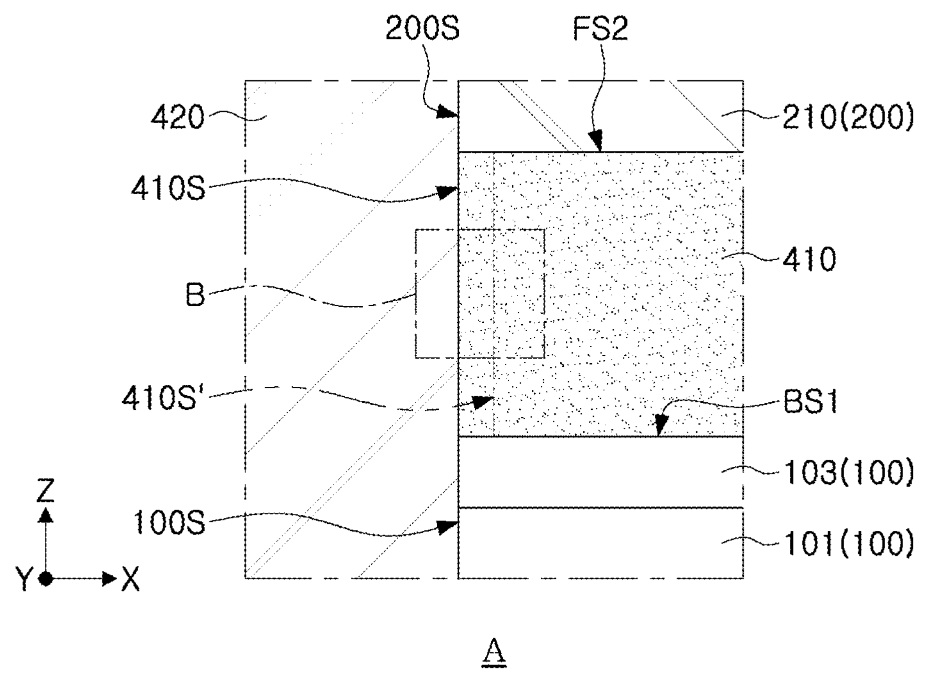
FIG. 2A is a partially enlarged view of region "A" of FIG. 1B.
Figure 2B:
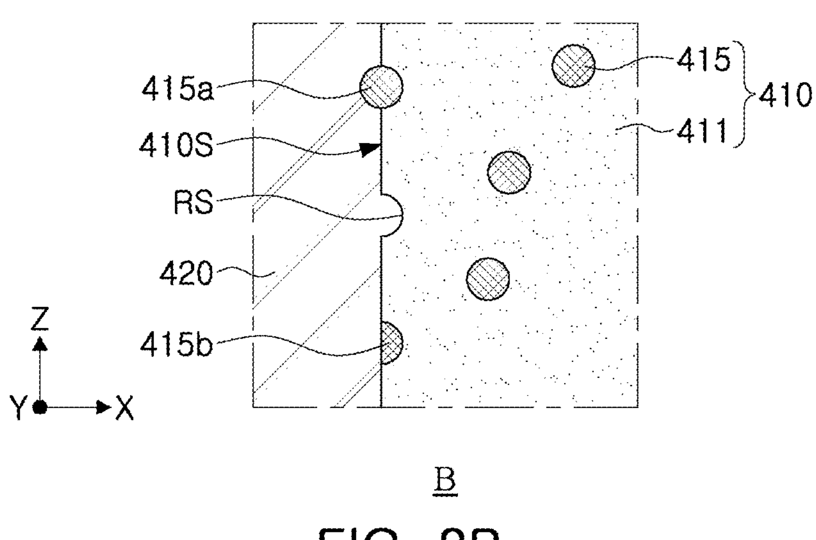
FIG. 2B is a partially enlarged view of region "B" of FIG. 2A.

FIG. 2A is a partially enlarged view of region "A" of FIG. 1B, and FIG. 2B is a partially enlarged view of region "B" of FIG. 2A.

Figure 7A:
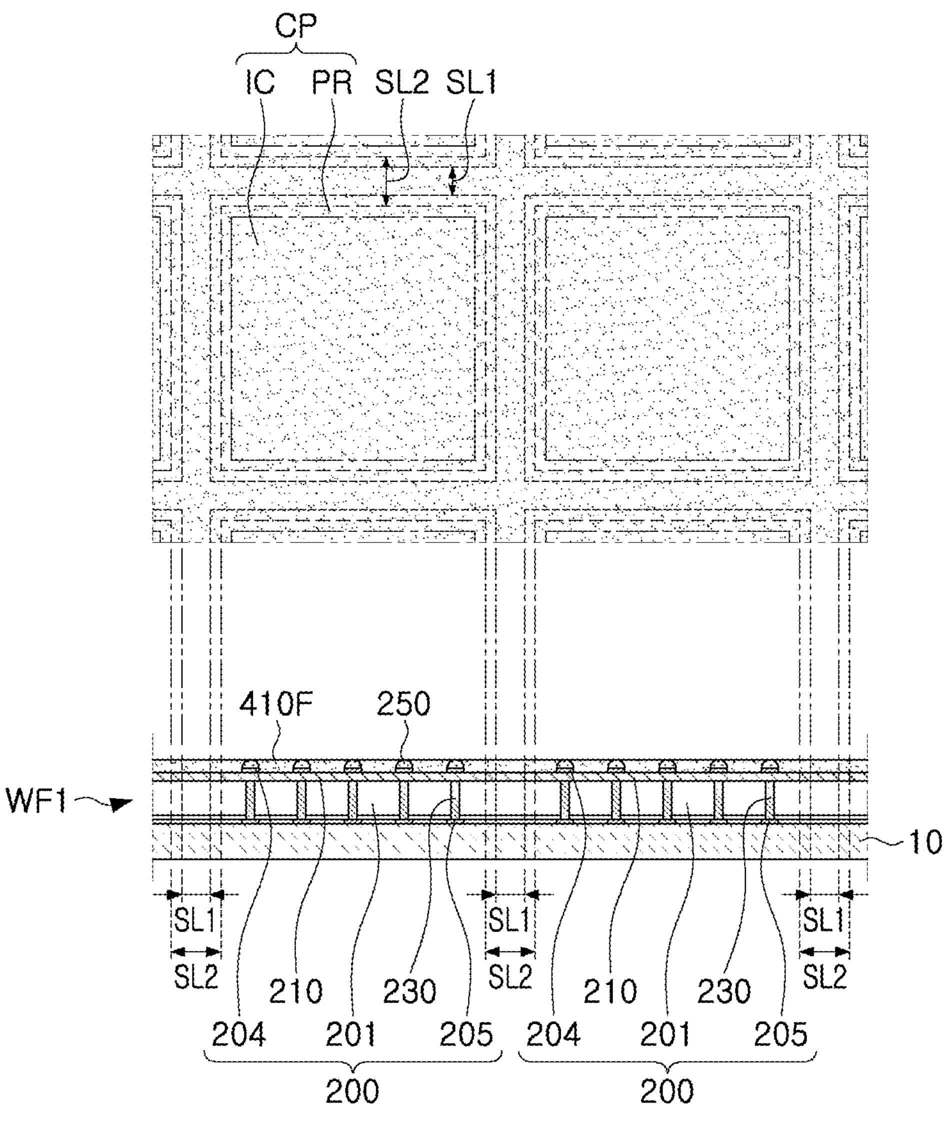
Figure 7B:
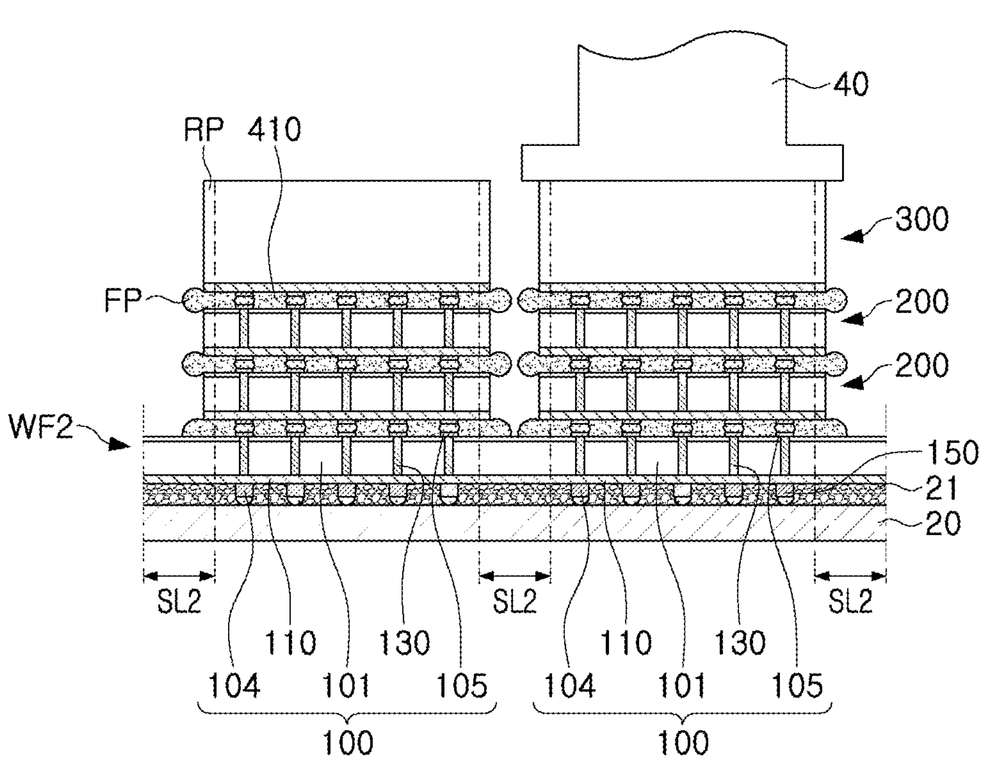
Figure 7C:
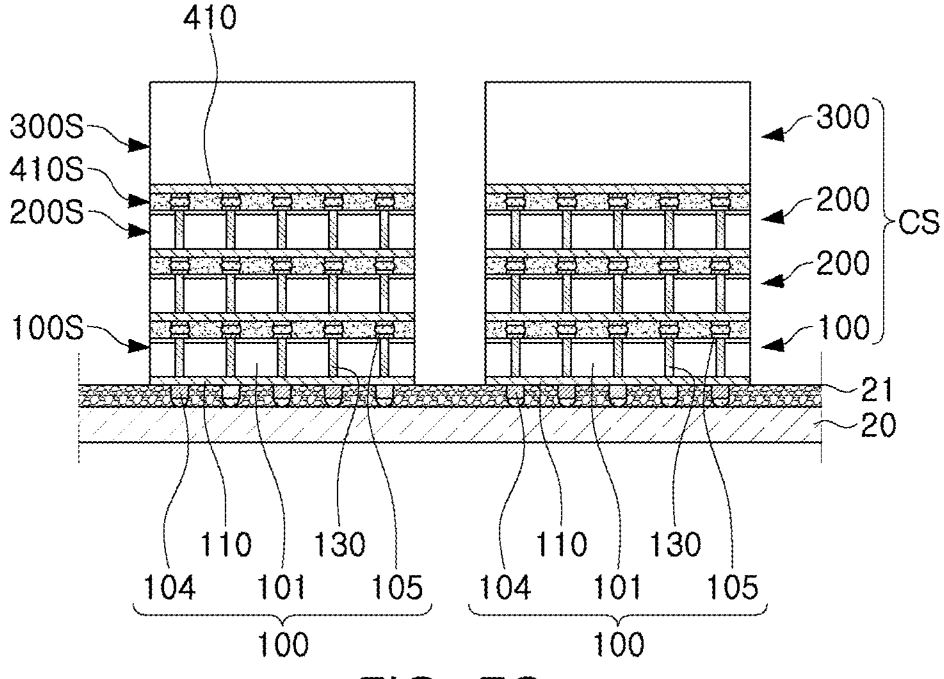

Referring to FIGS. 1A, 1B, 2A, and 2B, a semiconductor package 1000 according to some example embodiments may include a plurality of semiconductor chips 100, 200, and 300 on a base chip 400, bump structures 150, 250, and 350, at least one adhesive layer 410, and an encapsulant 420. In a thermal compression bonding process for stacking the plurality of semiconductor chips 100, 200, and 300 on the base chip 400 and fixing the plurality of semiconductor chips 100, 200, and 300 to the base chip 400, fillet portions ("FP" in FIG. 7B) of the adhesive layers protruding from side surfaces of the plurality of semiconductor chips 100, 200, and 300 may cause a defect in exterior portions and a decrease in reliability of a semiconductor package. According to some example embodiments, second and third semiconductor chips 200 and 300, on which a primary sawing process is performed, may have an oversized size. The second and third semiconductor chips 200 and 300 may be thermal compression bonded onto a wafer for providing a first semiconductor chip 100. Then a secondary sawing process may be performed thereon, thereby obtaining chip stacks CS in which the first to third semiconductor chips 100, 200, and 300 have a designed size and are vertically stacked. Thereafter, in the second sawing process, the fillet portions FP of the adhesive layers 410 may be reduced or entirely removed along with remaining portions RP of the second and third semiconductor chips 200 and 300 (FIGS. 7A to 7C). In addition, the chip stacks CS may be mounted on a wafer for providing the base chip 400 and then a molding process may be performed thereon, thereby forming a molded underfill (MUF) between the chip stacks CS and the base chip 400 (see FIGS. 7D TO 7F). As a result, the semiconductor package 1000, having improved reliability, may be implemented by reducing or entirely removing the fillet portions of the adhesive layers 410.

Hereinafter, respective components will be described in detail with reference to the drawings.

The plurality of semiconductor chips 100, 200, and 300 may include memory chips or memory devices storing or outputting data based on address commands and control commands received from the base chip 400. For example, the plurality of semiconductor chips 100, 200, and 300 may include volatile memory devices such as DRAM and SRAM or non-volatile memory devices such as PRAM, MRAM, FeRAM, and/or RRAM. Among the plurality of semiconductor chips 100, 200, and 300, an uppermost semiconductor chip 300 (hereinafter referred to as "third semiconductor chip") may not include a through-via, and a back surface BS3 thereof may be exposed from the encapsulant 420, but the present inventive concept is not limited thereto.

The plurality of semiconductor chips 100, 200, and 300 may include a first semiconductor chip 100, at least one second semiconductor chip 200, and a third semiconductor chip 300 sequentially stacked on a base chip 400.

The base chip 400 may include a substrate 401, an upper protective layer 403, an upper pad 405, a lower pad 404, a device layer 406, and a through-electrode 430. The base chip 400 may be, for example, a buffer chip including multiple logic devices and/or memory devices in the device layer 406. Accordingly, the base chip 400 may transmit a signal from the plurality of semiconductor chips 100, 200, and 300 stacked thereon to the outside, and may also transmit a signal and power from the outside to the plurality of semiconductor chips 100, 200, and 300. The base chip 400 may perform both logic and memory functions via logic devices and memory devices. However, in some example embodiments, the base chip 400 may include only logic devices, and thus may perform only logic functions.

The substrate 401 may include, for example, a semiconductor element such as silicon or germanium (Ge), or a compound semiconductor such as silicon carbide (SiC), gallium arsenide (GaAs), indium arsenide (InAs), or indium phosphide (InP). The substrate 401 may have a silicon on insulator (SOI) structure. The substrate 401 may include a conductive region, for example, a well doped with impurities or a structure doped with impurities. The substrate 401 may include various device isolation structures such as a shallow trench isolation (STI) structure.

The upper protective layer 403 may be formed on an upper surface of the substrate 401, and may protect the substrate 401. The upper protective layer 403 may be formed of an insulating layer such as a silicon oxide film, a silicon nitride film, or a silicon oxynitride film, but a material of the upper protective layer 403 is not limited to the above-described materials. For example, the upper protective layer 403 may be formed of a polymer such as polyimide (PI) or photosensitive polyimide (PSPI). Although not illustrated in the drawing, a lower protective layer may be further formed on a lower surface of the device layer 406.

The upper pad 405 may be disposed on an upper surface US of the base chip 400 (or on the upper protective layer 403). The upper pad 405 may include, for example, at least one of aluminum (Al), copper (Cu), nickel (Ni), tungsten (W), platinum (Pt), and gold (Au). The lower pad 404 may be disposed on a lower surface SL of the base chip 400 (or a lower portion of the device layer 406), and may include a material similar to that of the upper pad 405. However, materials of the upper pad 405 and the lower pad 404 are not limited to the above-described materials.

The device layer 406 may be disposed on a lower surface of the substrate 401, and may include various types of devices. For example, the device layer 406 may include a field effect transistor (FET) such as a planar FET or FinFET, a memory device such as a flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM), or resistive random access memory (RRAM), a logic device such as AND, OR, or NOT, various active devices and/or passive devices such as system large-scale integration (LSI), a CMOS imaging sensor (CIS), and a micro-electro-mechanical system (MEMS).

The device layer 406 may include an interlayer insulating layer (not illustrated) and a multilayer wiring layer (not illustrated) on the above-described devices. The interlayer insulating layer (not illustrated) may include silicon oxide or silicon nitride. The multilayer wiring layer (not illustrated) may include a multilayer wiring and/or a vertical contact. The multilayer wiring layer (not illustrated) may connect devices of the device layer 406 to each other, connect the devices to a conductive region of the substrate 401, or connect the devices to the lower pad 404.

The through-electrodes 430 may pass through the substrate 401 in a vertical direction (Z-direction) and provide an electrical path connecting the upper pad 405 and the lower pads 404 to each other. The through-electrodes 430 may be electrically connected to the plurality of semiconductor chips 100, 200, and 300. The through-electrodes 430 may include a conductive plug and a barrier film surrounding the conductive plug. The conductive plug may include a metal material such as tungsten (W), titanium (Ti), aluminum (Al), and/or copper (Cu). The conductive plug may be formed using a plating process, a PVD process, or a CVD process. The barrier film may include titanium (Ti), titanium nitride (TiN), tantalum (Ta), and/or tantalum nitride (TaN), and may be formed using a plating process, a PVD process, or a CVD process. A side insulating film (not illustrated), including an insulating material (for example, high aspect ratio process (HARP) oxide) such as silicon oxide, silicon nitride, or silicon oxynitride, may be formed between side surfaces of the through-electrodes 430 and the substrate 401.

Connection bumps 450 may be disposed below the base chip 400. The connection bumps 450 may be electrically connected to the plurality of semiconductor chips 100, 200, and 300 via the through-electrode 430. The connection bumps 450 may include, for example, tin (Sn) or an alloy (for example, Sn-Ag—Cu) containing tin (Sn). In some example embodiments, the connection bumps 450 may have a combination of a metal pillar and a solder ball. The connection bumps 450 may be electrically connected to an external device such as a module substrate or a system board. The base chip 400 may have a width wider than that of each of the plurality of semiconductor chips 100, 200, and 300 in a horizontal direction (a direction, parallel to the upper surface US) (for example, an X-direction and/or a Y-direction). At least a portion of the connection bumps 450 and at least a portion of the lower pads 404 may be disposed at positions not overlapping those of the plurality of semiconductor chips 100, 200, and 300 in the vertical direction (Z-direction).

The first semiconductor chip 100 may be disposed on the base chip 400, and may include a first substrate 101, a first back protective layer 103, first front pads 104 disposed on a first front surface FS1, first back pads 105 disposed on a first back surface BS1, a first device layer 110, and first through-vias 130 electrically connecting the first front pads 104 and the first back pads 105 to each other. The first substrate 101, the first back protective layer 103, the first front pads 104, the first back pads 105, the first device layer 110, and the first through-vias 130 may have features the same as or similar to those of the substrate 401, the upper protective layer 403, the upper pad 405 and the lower pad 404, the device layer 406, and the through-electrodes 430, corresponding components of the above-described base chip 400, and thus a repeated description will be omitted. The first semiconductor chip 100 may have a first front surface FS1 on which the first front pads 104 are disposed, a first back surface BS1 on which the first back pads 105 are disposed, and a first side surface 100S extending from an edge of the first front surface FS1 to an edge of the first back surface BS1.

The encapsulant 420 may be filled between the base chip 400 and the first semiconductor chip 100, such that a first distance d1 between the base chip 400 and the first semiconductor chip 100 may be greater than a second distance d2 between the plurality of second semiconductor chips 200 and the third semiconductor chip 300. For example, the first distance d1 may be in a range of about 10 μm to about 30 μm, or about 15 μm to about 25 μm, and the second distance d2 may be in a range of about 1 μm to about 20 μm, or about 5 μm to about 15 μm, but the present inventive concepts are not limited thereto. The first distance d1 may be modified in various manners according to fluidity of the encapsulant 420. In addition, heights of the upper pads 405 of the base chip 400 and heights of the first front pads 104 of the first semiconductor chip 100 may be different from each other. In some example embodiments, the heights of the first front pads 104 may be greater than heights of the upper pads 105, heights of the second and third front pads 204 and 304, and heights of the first and second back pads 105 and 205.

The second semiconductor chip 200 may be disposed on the first semiconductor chip 100, and may include a second substrate 201, a second back protective layer 203, second front pads 204 disposed on a second front surface FS2, second back pads 205 disposed on a second back surface BS2, a second device layer 210, and second through-vias 230 electrically connecting the second front pads 204 and the second back pads 205 to each other. The second substrate 201, the second back protective layer 203, the second front pads 204, the second back pads 205, the second device layer 210, and the second through-vias 230 may have features the same as or similar to those of the substrate 401, the upper protective layer 403, the upper pad 405 and the lower pad 404, the device layer 406, and the through-electrodes 430, corresponding components of the above-described base chip 400, and thus a repeated description will be omitted. In some example embodiments, the second semiconductor chip 200 may include a plurality of second semiconductor chips stacked on the first semiconductor chip 100 in the vertical direction (Z-direction).

The plurality of second semiconductor chips 200 may respectively have a second front surface FS2 on which the second front pads 204 are disposed, a second back surface BS2 on which the second back pads 205 are disposed, and a second side surface 200S extending from an edge of the second front surface FS2 to an edge of the second back surface BS2. The plurality of second semiconductor chips 200 may be electrically connected to each other via the second through-vias 230, electrically connecting the second front pads 204 and the second back pads 205 to each other. In some example embodiments, the number of the plurality of second semiconductor chips 200 may be one or three or more.

The third semiconductor chip 300 may be disposed on the second semiconductor chip 200, and may include a third substrate 301, third front pads 304 disposed on a third front surface FS3, and a third device layer 310. The third substrate 301, the third front pads 304, and the third device layer 310 may have feature the same as or similar to those of the substrate 401, the lower pads 404, and the device layer 406, corresponding components of the above-described base chip 400, and thus a repeated description will be omitted. The third semiconductor chip 300 may have a third front surface FS3 on which the third front pads 304 are disposed, a third back surface BS3 opposite thereto, and a third side surface 300S extending from an edge of the third front surface FS3 to an edge of the third back surface BS3. The third semiconductor chip 300 may be disposed on an uppermost side of the plurality of semiconductor chips 100, 200, and 300, and the third back surface BS3 may be exposed from the encapsulant 420. In addition, the third semiconductor chip 300 may have a thickness greater than a thickness of the first semiconductor chip 100 and a thickness of each of the plurality of second semiconductor chips 200.

The bump structures 150, 250, and 350 may be disposed between the plurality of semiconductor chips 100, 200, and 300. For example, the bump structures 150, 250, and 350 may include first bump structures 150 disposed between the base chip 400 and the first front surface FS1 of the first semiconductor chip 100, second bump structures 250 disposed on the second front surface FS2 of each of the second semiconductor chips 200, and third bump structures 350 disposed between the third front surface FS3 of the third semiconductor chip 300 and an uppermost second semiconductor chip 200. The bump structures 150, 250, and 350 may electrically connect pads, opposing each other, to each other. The first bump structures 150 may electrically connect, to each other, the upper pads 405 of the base chip 400 and the first front pads 104 of the first semiconductor chip 100. The second bump structures 250 may electrically connect the first back pads 105 of the first semiconductor chip 100 to front pads 204 of a plurality of second semiconductor chips 200 of a lowermost second semiconductor chip 200. The third bump structures 350 may electrically connect, to each other, the second back pads 205 of the uppermost second semiconductor chip 200 and the third front pads 304 of the third semiconductor chip 300. The bump structures 150, 250, and 350 may include, for example, tin (Sn), indium (In), bismuth (Bi), antimony (Sb), copper (Cu), silver (Ag), zinc (Zn), lead (Pb) and/or alloys thereof. The alloys may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, and the like.

The adhesive layers 410 may surround some bump structures (for example, "250" and "350"), among the bump structures 150, 250, and 350, disposed between the plurality of semiconductor chips 100, 200, and 300, and may fix the plurality of semiconductor chips 100, 200, and 300 onto the base chip 400. The adhesive layers 410 may be respectively disposed on the second front surface FS2 of each of the plurality of second semiconductor chips 200 and the third front surface FS3 of the third semiconductor chip 300. The adhesive layers 410 may include a first adhesive layer, surrounding the second bump structures 250 below the second semiconductor chip 200, and a second adhesive layer, surrounding the third bump structures 350 below the third semiconductor chip 300.

According to example embodiments, fillet portions FP of the adhesive layers 410, protruding outwardly from the plurality of semiconductor chips 100, 200, and 300, may be removed, thereby improving reliability of the semiconductor package 1000 (See FIGS. 7B-7C). Accordingly, the adhesive layers 410 may have a width equal to or less than a width of the first semiconductor chip 100, a width of each of the plurality of second semiconductor chips 200, and a width of the third semiconductor chip 300. In addition, the adhesive layers 410 may overlap or entirely overlap the plurality of semiconductor chips 100, 200, and 300 in the vertical direction (Z-direction). That is, side surfaces 410S of the adhesive layers 410 may be coplanar with respective side surfaces 100S, 200S, and 300S of the plurality of semiconductor chips 100, 200, and 300, or may be positioned more inwardly than the respective side surface 100S, 200S, and 300S. A first side surface 100S of the first semiconductor chip 100, a second side surface 200S of the second semiconductor chip 200, and a third side surface 300S of the third semiconductor chip 300 may be coplanar with the side surfaces 410S of the adhesive layers 410. In some example embodiments, a side surface 410S' of the at least one adhesive layer 410 may have a step with the first side surface 100S, the second side surface 200S, and the third side surface 300S (see FIG. 2A). Here, "being coplanar" does not necessarily mean forming a single plane, but means a surface formed by the same sawing process. That is, in some example embodiments, the side surfaces 410S of the adhesive layers 410 may not be parallel to the respective side surfaces 100S, 200S, and 300S of the plurality of semiconductor chips 100, 200, and 300 (see FIGS. 3A to 3C).

The adhesive layers 410 may be non-conductive films (NCF), but the present inventive concept is not limited thereto, and may include, for example, all types of polymer films on which a thermal compression process may be performed. As illustrated in FIG. 2B, the adhesive layers 410 may include an insulating material layer 411 and fillers 415. The insulating material layer 411 may include, for example, a thermosetting resin such as an epoxy resin, and the fillers 415 may include an inorganic filler (for example, silica particle) having a diameter of 1 μm or less, but the present inventive concept is not limited thereto. A portion of fillers 415 may be exposed to the side surfaces 410S of the adhesive layers 410 or removed in the above-described secondary sawing process (see FIGS. 7B and 7C). For example, at least a portion of fillers **415*a* may protrude from the side surfaces 410S of the adhesive layers 410 to be in contact with the encapsulant 420. For example, at least a portion of fillers 415*b* may have cut surfaces coplanar with the side surfaces 410S of the adhesive layers 410. For example, at least a portion of fillers may be removed from the side surfaces 410S of the adhesive layers 410 to define a recess RS in contact with the encapsulant 420**.

The encapsulant 420 may seal the plurality of semiconductor chips 100, 200, and 300 on the base chip 400. The encapsulant 420 may be formed to expose the back surface BS3 of the third semiconductor chip 300. In some example embodiments, the encapsulant 420 may be formed to cover the back surface BS3 of the third semiconductor chip 300. The encapsulant 420 may be formed of, for example, an insulating material such as an epoxy mold compound (EMC), but a material of the encapsulant 420 is not particularly limited. The encapsulant 420 may surround side surfaces of the plurality of semiconductor chips 100, 200, and 300. The encapsulant 420 may surround the first bump structures 150 disposed between the base chip 400 and the first semiconductor chip 100, and may be in direct contact with the respective side surfaces 100S, 200S, and 300S of the plurality of semiconductor chips 100, 200, and 300 and the side surfaces 410S of the adhesive layers 410. In some example embodiments, a heat dissipation structure (not illustrated) may be disposed on an upper portion of the encapsulant 420. The heat dissipation structure (not illustrated) may control warpage of the semiconductor package 1000 and may discharge heat, generated in the plurality of semiconductor chips 100, 200, and 300, to the outside.

Figure 3A:
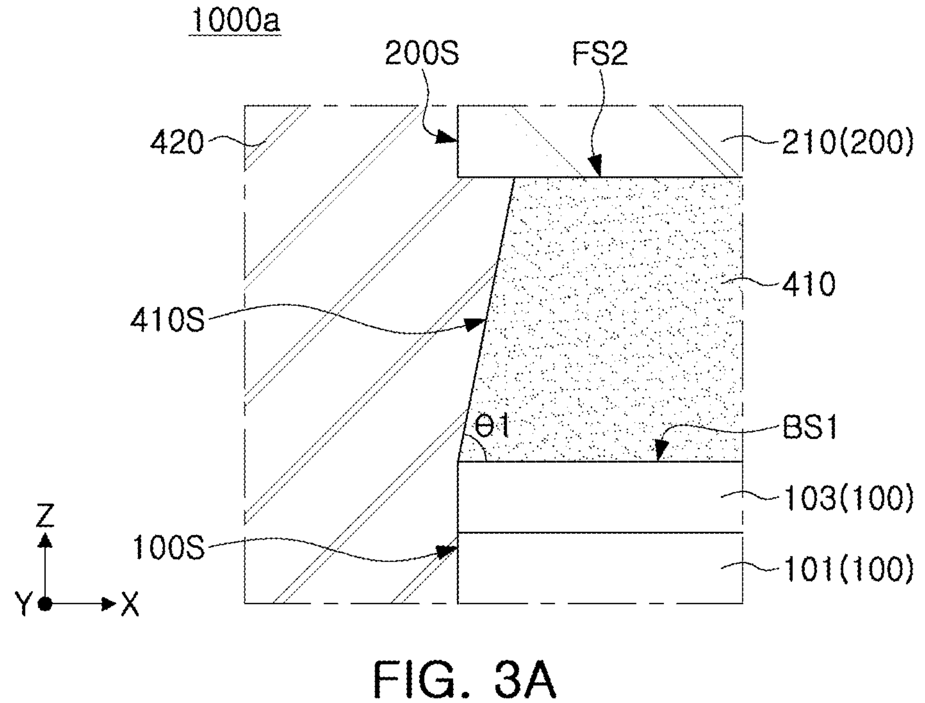
FIGS. 3A to 3C are partially enlarged views of a modification of a side surface of the adhesive layer illustrated in FIG. 2A.
Figure 3B:
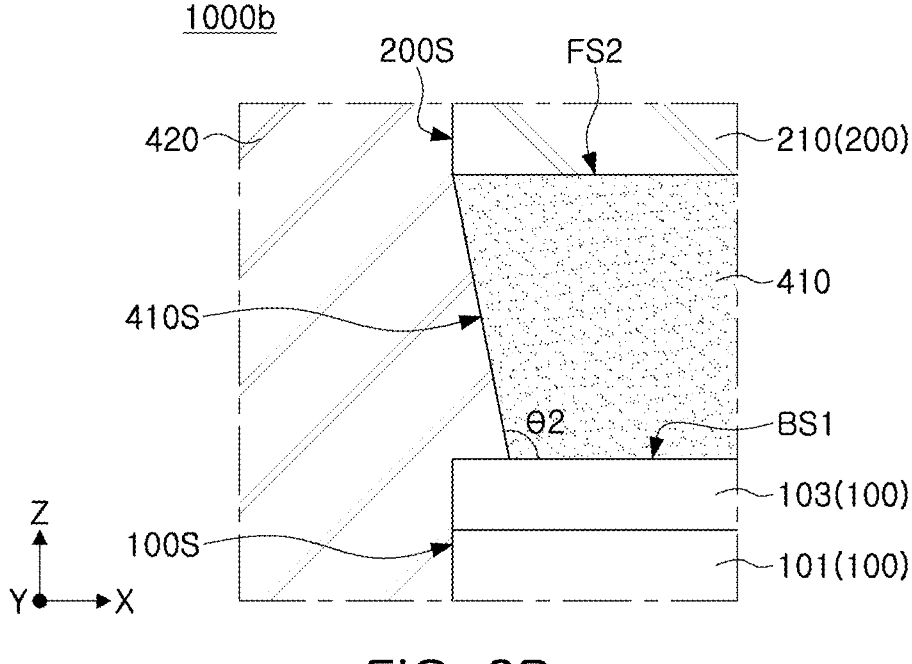
Figure 3C:
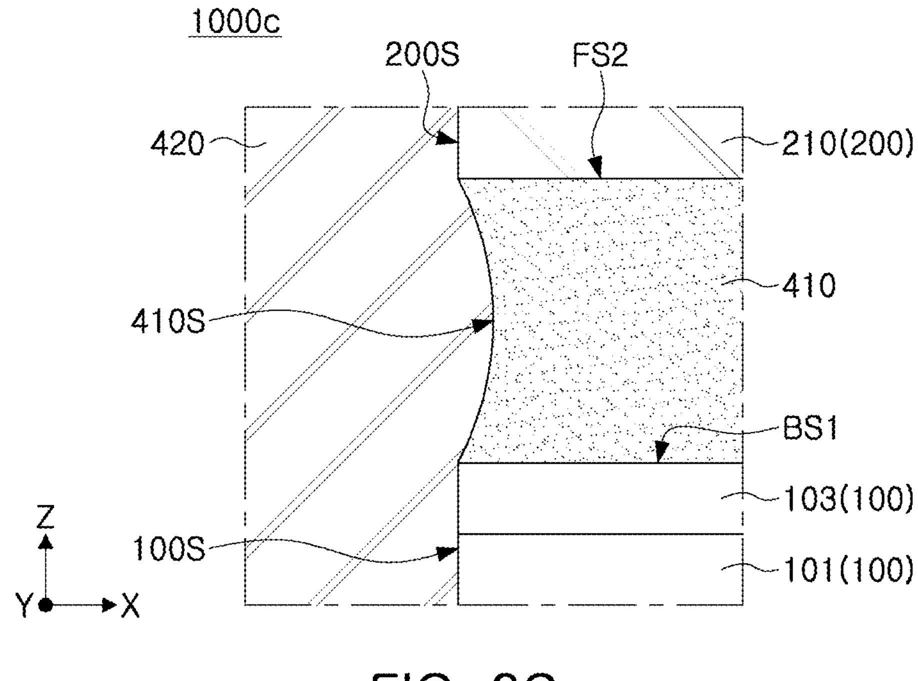

FIGS. 3A to 3C are partially enlarged views of a modification of a side surface 410S of the adhesive layer 410 illustrated in FIG. 2A.

Referring to FIG. 3A, in a semiconductor package **1000*a* according to a modification, a side surface 410S of at least one adhesive layer 410 may have an inclination with respect to side surfaces (for example, 100S and 200S) of semiconductor chips. For example, a side surface 410S of the adhesive layer 410 disposed on a second front surface FS2 of a lowermost second semiconductor chip 200 may have an inclination with respect to a first back surface BS1 of a first semiconductor chip 100. A first angle θ1 between the side surface 410S of the adhesive layer 410 and the first back surface BS1 of the first semiconductor chip 100** may be about 90° or less.

Referring to FIG. 3B, in a semiconductor package **1000*b* according to a modification, a side surface 410S of at least one adhesive layer 410 may have an inclination with respect to side surfaces (for example, 100S and 200S) of semiconductor chips. For example, a second angle θ2 between the side surface 410S of the adhesive layer 410 and a first back surface BS1 of a first semiconductor chip 100** may be about 90° or more.

Referring to FIG. 3C, in a semiconductor package 1000*c* according to a modification, a side surface 410S of at least one adhesive layer 410 may be a curved surface. For example, the side surface 410S of the adhesive layer 410 may be an inwardly concave curved surface. Thus, in some example embodiments, the side surfaces 410S of the adhesive layers 410 may not be planes parallel to side surfaces 100S, 200S, and 300S of a plurality of semiconductor chips 100, 200, and 300, but may not have fillet portions protruding more outwardly than the side surfaces 100S, 200S, and 300S of the plurality of semiconductor chips 100, 200, and 300.

Figure 4:
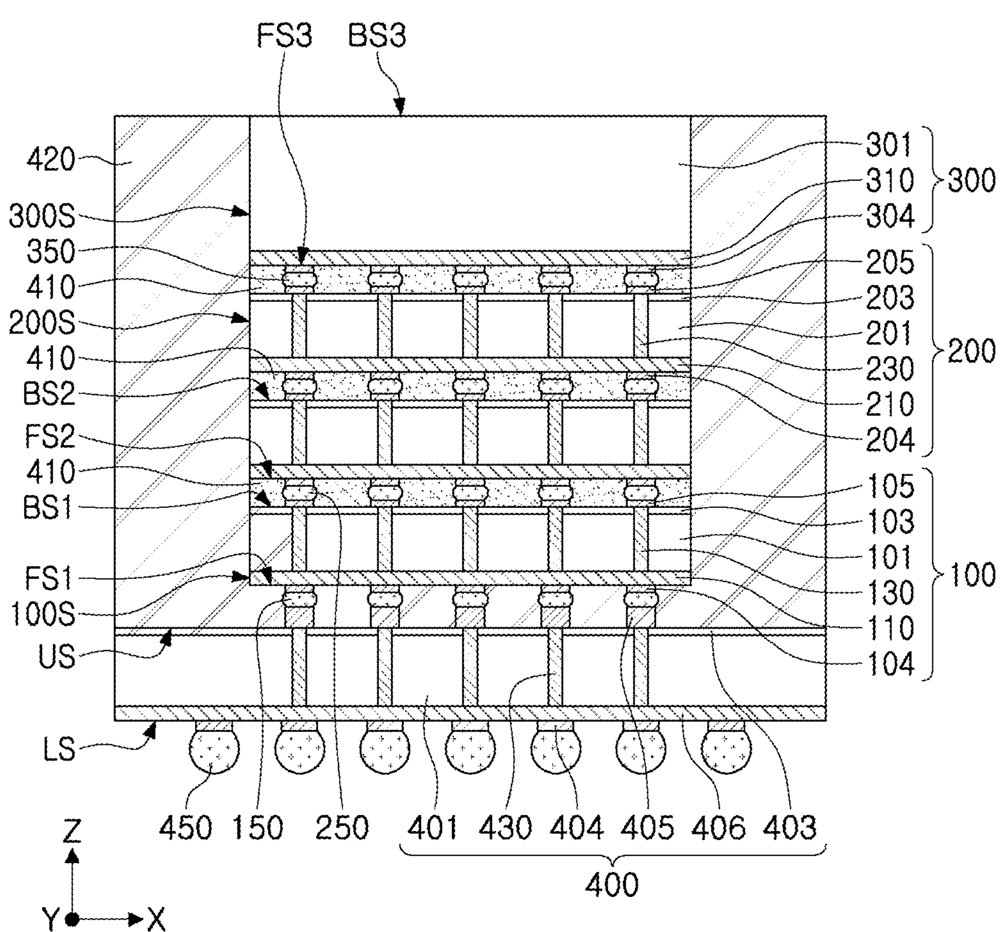
FIG. 4 is a cross-sectional view of a semiconductor package according to some example embodiments of the present inventive concepts.

FIG. 4 is a cross-sectional view of a semiconductor package 1000A according to some example embodiments of the present inventive concepts.

Referring to FIG. 4, the semiconductor package 1000A according to some example embodiments may have features the same as or similar to those described with reference to FIGS. 1A to 3C, except that heights of upper pads 405 of a base chip 400 are greater than heights of first front pads 104 of a first semiconductor chip 100. In the present example embodiments, the heights of the upper pads 405 may be greater than the heights of the first front pads 104, heights of the second and third front pads 204 and 304, and heights of the first and second back pads 105 and 205. Thus, a relatively large distance may be secured between the base chip 400 and the first semiconductor chip 100, thereby improving fillability of an encapsulant 420. A distance between the base chip 400 and the first semiconductor chip 100 may be designed in consideration of fluidity of the encapsulant 420.

Figure 5:
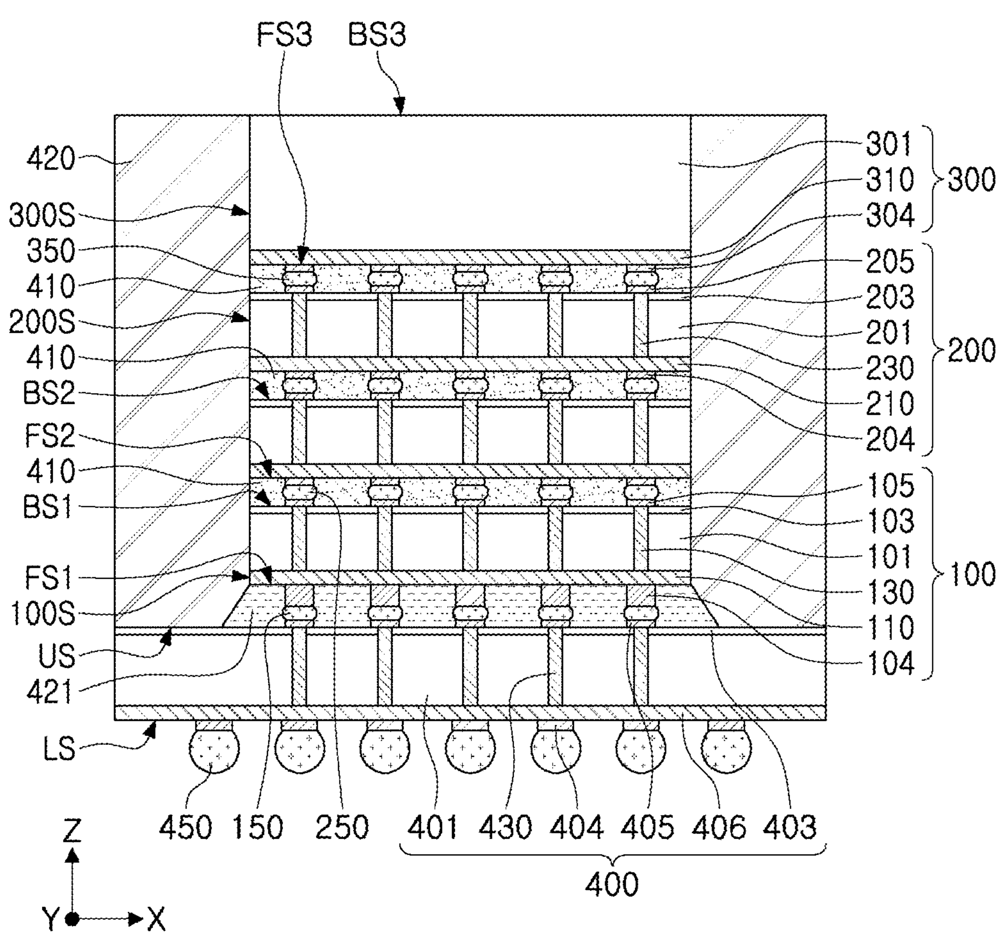
FIG. 5 is a cross-sectional view of a semiconductor package according to some example embodiments of the present inventive concepts.

FIG. 5 is a cross-sectional view of a semiconductor package 1000B according to some example embodiments.

Referring to FIG. 5, a semiconductor package 1000B according to some example embodiments may have features the same as or similar to those described with reference to FIGS. 1A to 4, except that an underfill portion 421 is formed between a base chip 400 and a first semiconductor chip 100. The encapsulant 420 may include the underfill portion 421, surrounding first bump structures 150, between the base chip 400 and the first semiconductor chip 100. The underfill portion 421 may be formed using a capillary underfill (CUF) process. The underfill portion 421 may have a width wider than that of each of the adhesive layers 410.

Figure 6A:
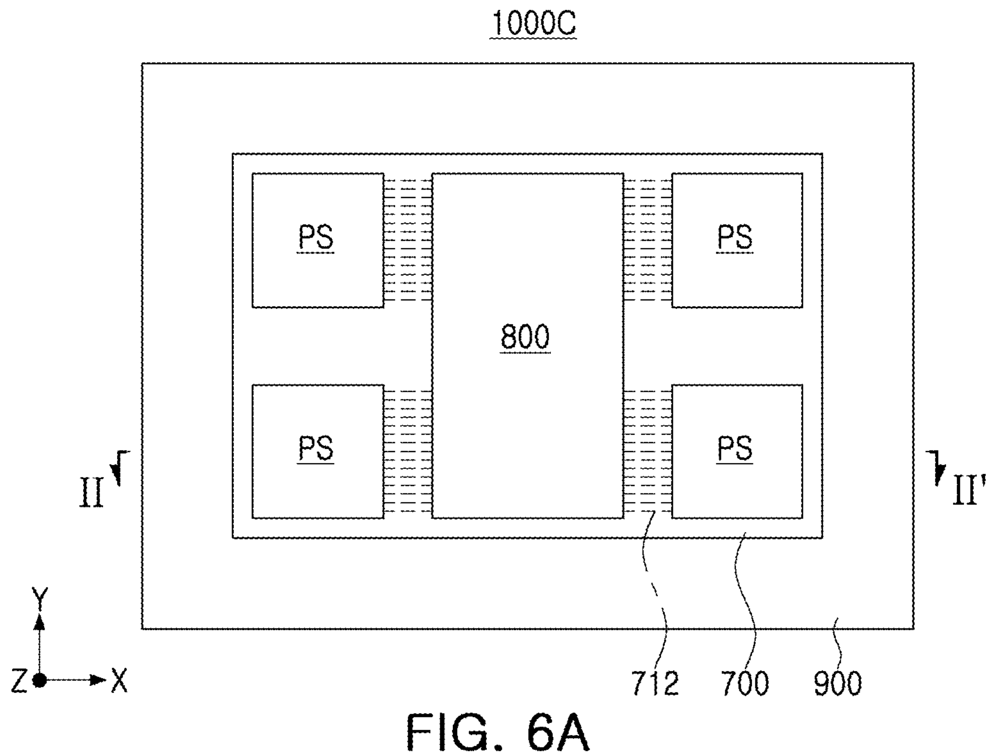
FIG. 6A is a plan view of a semiconductor package according to some example embodiments.
Figure 6B:
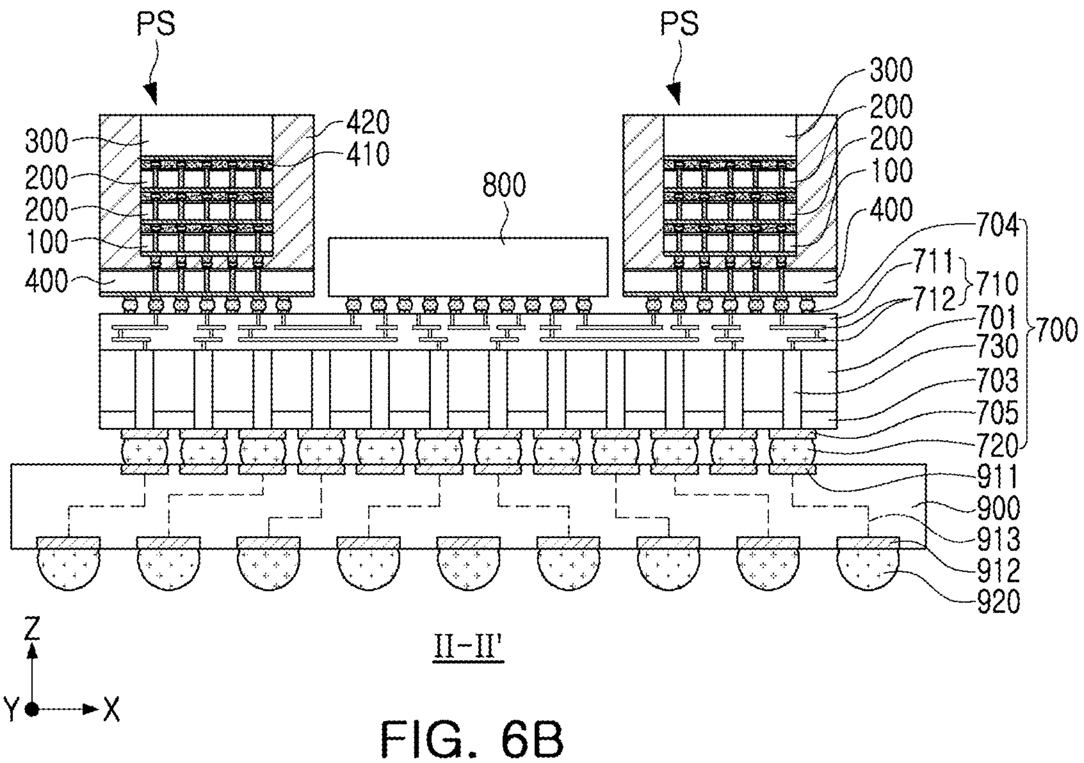
FIG. 6B is a cross-sectional view taken along line II-II' of FIG. 6A.

FIG. 6A is a plan view of a semiconductor package 1000C according to some example embodiments, and FIG. 6B is a cross-sectional view taken along line II-II' of FIG. 6A.

Referring to FIGS. 6A and 6B, a semiconductor package 1000C according to some example embodiments may include a package substrate 900, an interposer substrate 700, at least one chip structure PS, and a processor chip 800. The chip structure PS may have features the same as or similar to those of the semiconductor packages 1000, 1000A, 1000B, 1000*a*, 1000*b*, and 1000*c* described with reference to FIGS. 1A to 5.

The package substrate 900 may be a support substrate on which the interposer substrate 700, the processor chip 800, and the chip structure PS are mounted. The package substrate 900 may be a substrate for a semiconductor package including a printed circuit board (PCB), a ceramic substrate, a glass substrate, a tape wiring substrate, and the like. A body of the package substrate 900 may include different materials depending on a type of substrate. For example, when the package substrate 900 is a printed circuit board, the package substrate 900 may have a form in which a wiring layer is additionally stacked on one surface or opposite surfaces of a body copper-clad laminate or a copper-clad laminate.

The package substrate 900 may include a lower terminal 912, an upper terminal 911, and a redistribution circuit 913. The upper terminal 911, the lower terminal 912, and the redistribution circuit 913 may form an electrical path connecting a lower surface and an upper surface of the package substrate 900 to each other. The upper terminal 911, the lower terminal 912, and the redistribution circuit 913 may include a metal material, for example, at least one metal or an alloy containing two or more metals, among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and/or carbon (C). An external connection terminal 920 connected to the lower terminal 912 may be disposed on the lower surface of the package substrate 900. The external connection terminal 920 may include tin (Sn), indium (In), bismuth (Bi), antimony (Sb), copper (Cu), silver (Ag), zinc (Zn), lead (Pb), and/or alloys thereof.

The interposer substrate 700 may include a substrate 701, a lower protective layer 703, a lower pad 705, an interconnection structure 710, metal bumps 720, and through-vias 730. The chip structure PS and the processor chip 800 may be electrically connected to each other via the interposer substrate 700.

The substrate 701 may be formed as, for example, one of a silicon substrate, an organic substrate, a plastic substrate, and a glass substrate. When the substrate 701 is a silicon substrate, the interposer substrate 700 may be referred to as a silicon interposer. Unlike the drawings, when the substrate 701 is an organic substrate, the interposer substrate 700 may be referred to as a panel interposer.

The lower protective layer 703 may be disposed on a lower surface of the substrate 701, and the lower pad 705 may be disposed below the lower protective layer 703. The lower pad 705 may be connected to the through-via 730. The chip structure PS and the processor chip 800 may be electrically connected to a package substrate 600 via the metal bumps 720 disposed below the lower pad 705.

The interconnection structure 710 may be disposed on an upper surface of the substrate 701, and may include an interlayer insulating layer 711 and a single layer or multilayer wiring structure 712. When the interconnection structure 710 has a multilayer wiring structure, wiring patterns of different layers may be connected to each other via a contact via.

The through-via 730 may extend from the upper surface to the lower surface of the substrate 701 to pass through the substrate 701. In addition, the through-via 730 may extend into the interconnection structure 710 to be electrically connected to wirings of the interconnection structure 710. When the substrate 701 is silicon, the through-via 730 may be referred to as a TSV. In some example embodiments, the interposer substrate 700 may include only an interconnection structure therein, and may not include a through-via.

The interposer substrate 700 may be used for the purpose of converting or transmitting an input electrical signal between the package substrate 900 and the chip structure PS or the processor chip 800. Accordingly, the interposer substrate 700 may not include devices such as active devices or passive devices. In addition, in some example embodiments, the interconnection structure 710 may be disposed on a lower portion of the through-via 730. For example, the interconnection structure 710 and the through-via 730 may have a relative positional relationship therebetween.

The metal bump 720 may electrically connect the interposer substrate 700 and the package substrate 900 to each other. The chip structure PS may be electrically connected to the metal bump 720 through wirings of the interconnection structure 710 and the through-via 730. In some example embodiments, lower pads 705 used for power or ground are integrated and connected to the metal bumps 720, such that the number of lower pads 705 may be greater than the number of metal bumps 720.

The processor chip 800 may include, for example, a central processor (CPU), a graphics processor (GPU), a field programmable gate array (FPGA), a digital signal processor (DSP), a cryptographic processor, a microprocessor, a microcontroller, an analog-digital converter, an application specific integrated circuit (ASIC), and/or the like.

In some example embodiments, the semiconductor package 1000C may further include an internal sealant, covering the chip structure PS and the processor chip 800, on the interposer substrate 700. In addition, the semiconductor package 1000C may further include an external sealant, covering the interposer substrate 700 and the internal sealant, on the package substrate 900. The external sealant and the internal sealant may be formed together, and thus may not be distinguished from each other. In some example embodiments, the semiconductor package 1000C may further include a heat dissipation structure, covering the chip structure PS and the processor chip 800.

FIGS. 7A to 7F are schematic cross-sectional views of a process of manufacturing a semiconductor package 1000 according to some example embodiments of the present inventive concepts.

Referring to FIG. 7A, a first wafer WF1 for providing a second semiconductor chip 200 may be prepared. The first wafer WF1 may include components included in the second semiconductor chip 200. An adhesive film 410F, covering second bump structures 250, may be attached to the first wafer WF1. The first wafer WF1 may be temporarily supported on the first carrier 10 for a sawing process.

The first wafer WF1 may include a plurality of chip regions CP, a first scribe lane SL1, and a second scribe lane SL2. The chip regions CP may be regions in which the second semiconductor chips 200 are formed. For example, the chip regions CP may include an integrated circuit region IC and a peripheral region PR. The integrated circuit region IC may include a plurality of memory cells, a plurality of word lines and bit lines, and individual devices (for example, transistors). The peripheral region PR may be a region surrounding an edge of the integrated circuit region IC to protect the integrated circuit region IC in a sawing process. A circumference of the peripheral region PR may be defined by the second scribe lane SL2.

The first and second scribe lanes SL1 and SL2 may be regions isolating and/or dividing the chip regions CP. The first scribe lane SL1 may be a region for sawing the second semiconductor chip 200 to have an oversize in a primary sawing process. The second scribe lane SL2 may be a region defining a size of a final semiconductor chip. Using the primary sawing process, the first wafer WF1 may be divided into a plurality of second semiconductor chips 200 along the first scribe lane SL1. A difference in width between the first scribe lane SL1 and the second scribe lane SL2 may be about 50 μm or more, for example, about 50 μm to about 90 μm, about 60 μm to about 80 μm, and the like, but the present inventive concept is not limited thereto.

Referring to FIG. 7B, the second semiconductor chips 200 and a third semiconductor chip 300 may be sequentially stacked on a second wafer WF2 for a first semiconductor chip 100. The third semiconductor chip 300 may be in a state of being sawed to have an oversize using the primary sawing process described with reference to FIG. 7A. Accordingly, the second semiconductor chips 200 and the third semiconductor chip 300 may include a remaining portion RP defined by the second scribe lane SL2.

The second wafer WF2 may include a plurality of first semiconductor chips 100 divided by the second scribe lane SL2. The second wafer WF2 may be temporarily attached to a second carrier 20 by an adhesive material layer 21. The second semiconductor chips 200 and the third semiconductor chip 300 may be mounted on the second wafer WF2 by performing a thermal compression bonding process. The second semiconductor chips 200 and the third semiconductor chip 300 may be vacuum-suctioned to a bonding head 40 to be picked and placed. Due to the thermal compression bonding process, the adhesive layers 410 may respectively have a fillet portion FP protruding outwardly from the second semiconductor chips 200 and the third semiconductor chip 300. The fillet portions FP may cause a defect in exterior portions and a decrease in reliability of a semiconductor package. According to the present inventive concepts, the fillet portions FP may be reduced or entirely removed by a secondary sawing process, thereby preventing or reducing in likelihood a defect in exterior and a decrease in reliability.

Referring to FIG. 7C, a secondary sawing process may be performed along the second scribe lane SL2 to form chip stacks CS from which the fillet portion FP is removed or reduced. The chip stacks CS may include the first semiconductor chip 100, second semiconductor chips 200, and third semiconductor chips 300 being vertically stacked, and adhesive layers 410. The first semiconductor chip 100 may be formed by the second wafer WF2 divided using the secondary sawing process. In addition, the fillet portions FP of the adhesive layers 410 and the remaining portions RP of the second semiconductor chips 200 and the third semiconductor chip 300 may be removed or reduced together using the secondary sawing process.

Figure 7D:
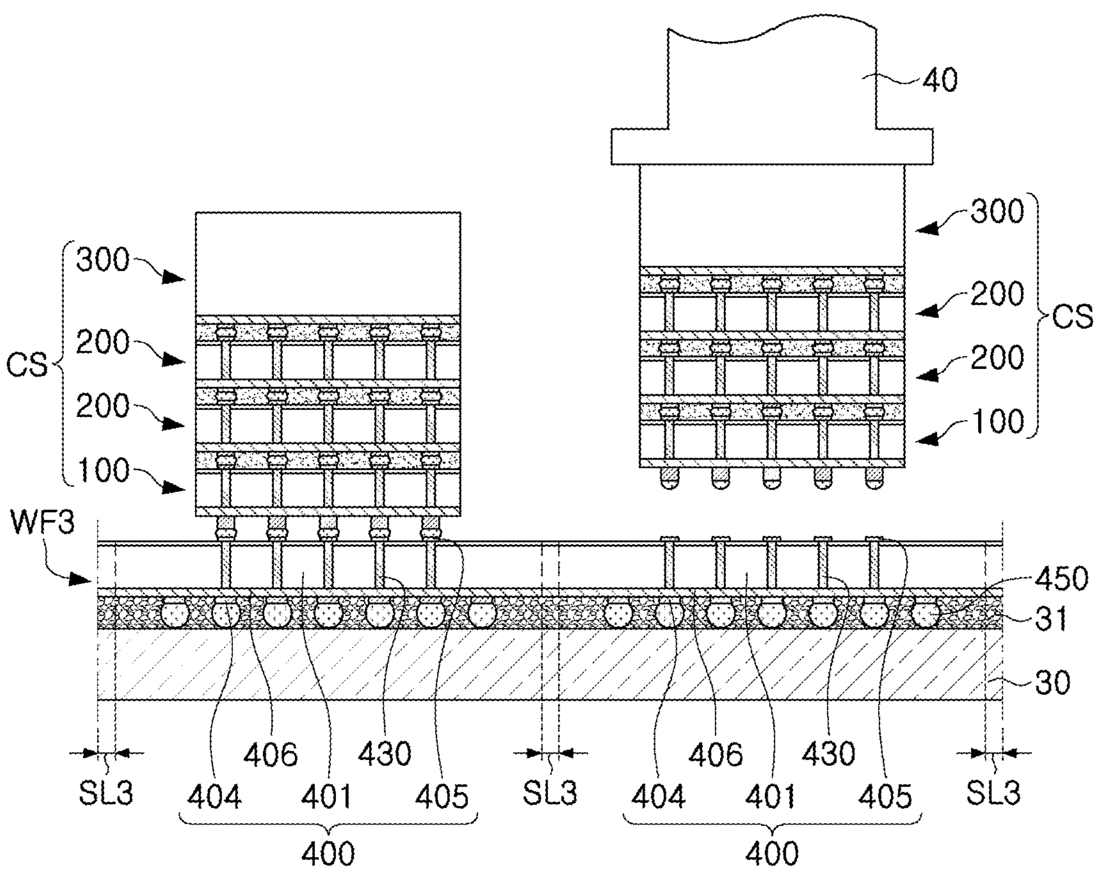

Referring to FIG. 7D, the chip stacks CS may be mounted on a third wafer WF3 for providing a base chip 400. The third wafer WF3 may include a plurality of base chips 400 divided by a third scribe lane SL3. The third wafer WF3 may be temporarily attached to a third carrier 30 by an adhesive material layer 31. The chip stacks CS may be mounted on the third wafer WF3 using a flip-chip bonding method. An adhesive film may not be disposed between the chip stacks CS and the third wafer WF3.

Figure 7E:
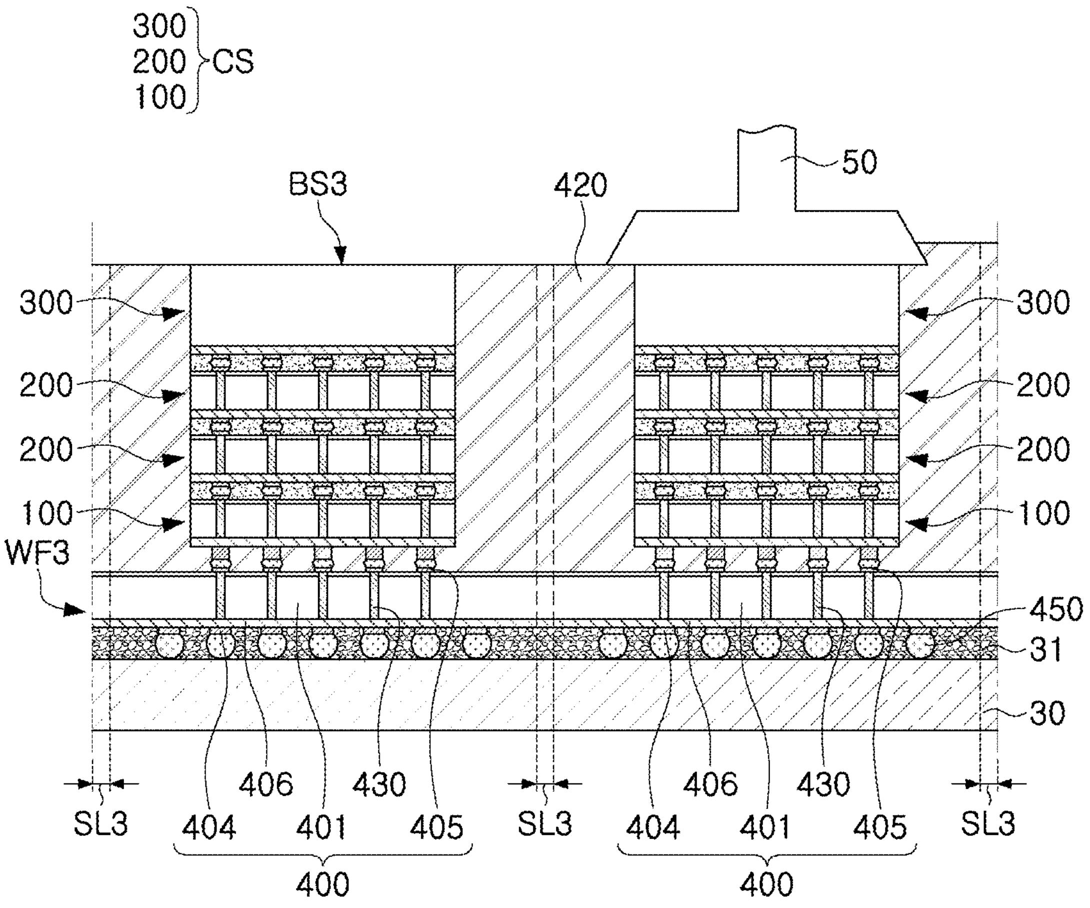

Referring to FIG. 7E, an encapsulant 420, covering the chip stacks CS, may be formed, and an upper surface of an encapsulant 420 may be planarized using polishing equipment 50. A back surface BS3 of the third semiconductor chip 300 may be exposed using a planarization process. The planarization process may be performed by, for example, a chemical mechanical polishing (CMP) process.

Figure 7F:
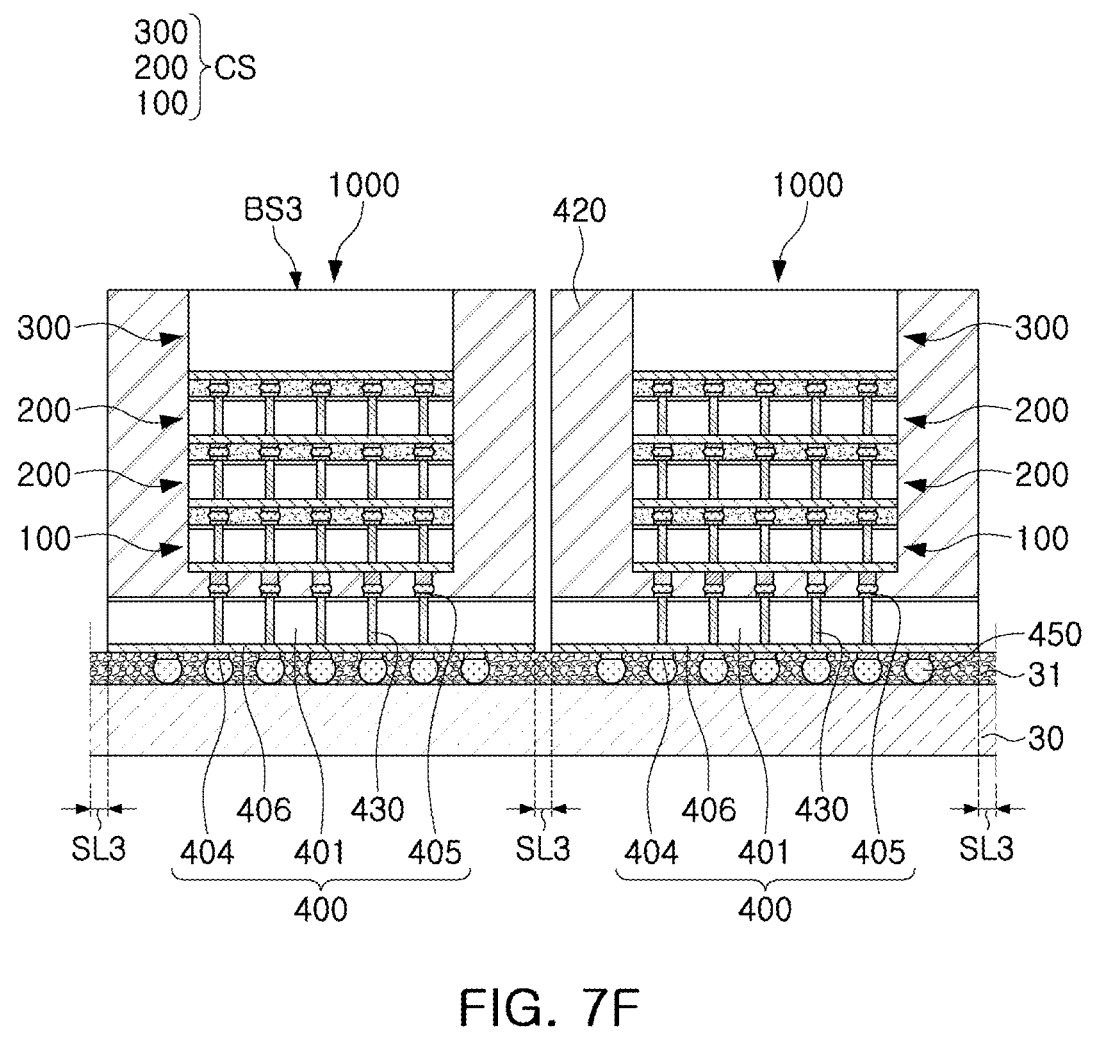

Referring to FIG. 7F, a plurality of semiconductor packages 1000 may be isolated by cutting the encapsulant 420 and the third wafer WF3 along the third scribe lane SL3. As described above, the plurality of semiconductor packages 1000 according to some example embodiments may include the chip stacks CS from which fillet portions of the adhesive layers 410 are removed, thereby preventing or reducing in likelihood a decrease in reliability caused by the fillet portions.

According to some example embodiments of the present inventive concepts, a fillet portion of an adhesive layer may be removed or reduced, thereby providing a semiconductor package having improved reliability.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a base chip including lower pads on a lower surface, upper pads on an upper surface, and through-electrodes electrically connecting the lower pads and the upper pads to each other;

a first semiconductor chip on the base chip, the first semiconductor chip including first front pads on a first front surface, first back pads on a first back surface, and first through-vias electrically connecting the first front pads and the first back pads to each other;

first bump structures on the first front surface of the first semiconductor chip, the first bump structures electrically connecting the first front pads and the upper pads to each other;

a plurality of second semiconductor chips sequentially stacked on the first semiconductor chip, the plurality of second semiconductor chips each including second front pads on second front surfaces, second back pads on second back surfaces, and second through-vias electrically connecting the second front pads and the second back pads to each other;

second bump structures on a second front surface of each of the plurality of second semiconductor chips, the second bump structures electrically connecting at least some pads facing each other among the first back pads, the second front pads, and the second back pads;

adhesive layers respectively on the second front surfaces of the plurality of second semiconductor chips, the adhesive layers surrounding the second bump structures; and an encapsulant surrounding the first bump structures between the base chip and the first semiconductor chip, the encapsulant covering at least a portion of each of the first semiconductor chip and the plurality of second semiconductor chips, wherein the adhesive layers respectively have a width equal to or less than a width of the first semiconductor chip and a width of each of the plurality of second semiconductor chips in a direction, parallel to the upper surface of the base chip, and wherein a first distance between the base chip and the first semiconductor chip is greater than a second distance between the first semiconductor chip and a lowermost second semiconductor chip, among the plurality of second semiconductor chips.

2. The semiconductor package of claim 1, wherein the first distance is in a range from about 15 μm to about 25 μm, and the second distance is in a range from about 5 μm to about 15 μm.

3. The semiconductor package of claim 1, wherein the encapsulant is in contact with side surfaces of the adhesive layers, a first side surface of the first semiconductor chip, and second side surfaces of the plurality of second semiconductor chips.

4. The semiconductor package of claim 1, wherein the adhesive layers include an insulating material layer and fillers in the insulating material layer.

5. The semiconductor package of claim 4, wherein at least one of the fillers protrude from side surfaces of the adhesive layers and is in contact with the encapsulant.

6. The semiconductor package of claim 4, wherein at least one of the fillers is removed from side surfaces of the adhesive layers, defining a recess in the insulating material layer contacting the encapsulant.

7. The semiconductor package of claim 1, wherein side surfaces of the adhesive layers have an inclination with respect to the first back surface of the first semiconductor chip.

8. The semiconductor package of claim 7, wherein an angle between the side surfaces of the adhesive layers and the first back surface of the first semiconductor chip is 90° or less.

9. The semiconductor package of claim 7, wherein an angle between the side surfaces of the adhesive layers and the first back surface of the first semiconductor chip is 90° or more.

10. The semiconductor package of claim 1, further comprising:

a third semiconductor chip on the plurality of second semiconductor chips, the third semiconductor chip including third front pads on a third front surface;

third bump structures on the third front surface of the third semiconductor chip, the third bump structures electrically connecting the third front pads and the second back pads to each other; and an additional adhesive layer on the third front surface of the third semiconductor chip, the additional adhesive layer surrounding the third bump structures.

11. The semiconductor package of claim 10, wherein a third back surface of the third semiconductor chip is exposed from the encapsulant.

12. The semiconductor package of claim 10, wherein the third semiconductor chip has a thickness greater than a thickness of the first semiconductor chip and a thickness of each of the plurality of second semiconductor chips.

13. The semiconductor package of claim 1, wherein the base chip has a width wider than a width of the first semiconductor chip and a width of each of the plurality of second semiconductor chips in a direction parallel to the upper surface of the base chip.

14. The semiconductor package of claim 1, wherein lengths of the upper pads of the base chip in a vertical direction and lengths of the first front pads of the first semiconductor chip in the vertical direction are different from each other.

15. A semiconductor package comprising:

a base chip;

a first semiconductor chip on the base chip;

first bump structures electrically connecting the base chip and the first semiconductor chip to each other;

a second semiconductor chip on the first semiconductor chip;

second bump structures electrically connecting the first semiconductor chip and the second semiconductor chip to each other;

a first adhesive layer surrounding the second bump structures below the second semiconductor chip; and an encapsulant surrounding the first bump structures below the first semiconductor chip, the encapsulant covering a first side surface of the first semiconductor chip, a second side surface of the second semiconductor chip, and a side surface of the first adhesive layer, wherein the first side surface of the first semiconductor chip, the second side surface of the second semiconductor chip, and the side surface of the first adhesive layer are coplanar with each other, and wherein a first distance between the base chip and the first semiconductor chip is greater than a second distance between the first semiconductor chip and the second semiconductor chip.

16. The semiconductor package of claim 15, wherein the first adhesive layer entirely overlaps the first semiconductor chip and the second semiconductor chip in a vertical direction.

17. The semiconductor package of claim 15, further comprising:

a third semiconductor chip on the second semiconductor chip, the third semiconductor chip having a third side surface covered by the encapsulant;

third bump structures electrically connecting the second semiconductor chip and the third semiconductor chip to each other; and a second adhesive layer surrounding the third bump structures below the third semiconductor chip, wherein a side surface of the second adhesive layer is coplanar with the first side surface of the first semiconductor chip, the second side surface of the second semiconductor chip, the side surface of the first adhesive layer, and the third side surface of the third semiconductor chip.

18. A semiconductor package comprising:

a base chip;

a plurality of semiconductor chips sequentially stacked on the base chip;

bump structures between the base chip and a lowermost semiconductor chip, among the plurality of semiconductor chips, the bump structures between the plurality of semiconductor chips;

at least one adhesive layer surrounding some bump structures, among the bump structures, between the plurality of semiconductor chips; and an encapsulant surrounding some bump structures, among the bump structures, between the base chip and the lowermost semiconductor chip, the encapsulant in direct contact with a side surface of each of the plurality of semiconductor chips and a side surface of the at least one adhesive layer, wherein a first distance between the base chip and the lowermost semiconductor chip is greater than a second distance between the lowermost semiconductor chip and a second semiconductor chip of the plurality of semiconductor chips on the lowermost semiconductor chip, the second semiconductor chip adjacent to the lowermost semiconductor chip in the plurality of semiconductor chips stacked on the base chip.

19. The semiconductor package of claim 18, wherein the side surface of each of the plurality of semiconductor chips and the side surface of the at least one adhesive layer are coplanar with each other.

20. The semiconductor package of claim 1, wherein the encapsulant extends between adjacent upper pads of the base chip.

* * * * *